(12) United States Patent
Tsutsui et al.

(10) Patent No.: US 12,063,013 B2
(45) Date of Patent: Aug. 13, 2024

(54) POWER AMPLIFIER

(71) Applicant: Murata Manufacturing Co., Ltd., Kyoto-fu (JP)

(72) Inventors: Takayuki Tsutsui, Nagaokakyo (JP); Masao Kondo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 489 days.

(21) Appl. No.: 17/550,640

(22) Filed: Dec. 14, 2021

(65) Prior Publication Data

US 2022/0200542 A1 Jun. 23, 2022

(30) Foreign Application Priority Data

Dec. 18, 2020 (JP) ................. 2020-210054

(51) Int. Cl.
*H03F 1/52* (2006.01)
*H03F 3/195* (2006.01)
*H03F 3/24* (2006.01)

(52) U.S. Cl.
CPC .............. *H03F 1/52* (2013.01); *H03F 3/195* (2013.01); *H03F 3/245* (2013.01); *H03F 2200/441* (2013.01); *H03F 2200/451* (2013.01); *H03F 2200/468* (2013.01)

(58) Field of Classification Search
CPC . H03F 1/52; H03F 3/195; H03F 3/245; H03F 2200/441; H03F 2200/451; H03F 2200/468

USPC ......................................................... 330/298
See application file for complete search history.

(56) References Cited

U.S. PATENT DOCUMENTS

| | | | |
|---|---|---|---|
| 6,580,321 B1 | 6/2003 | Arell et al. | |
| 10,116,274 B2 * | 10/2018 | Ripley | H01L 23/552 |
| 2021/0013847 A1 * | 1/2021 | Shimamoto | H03F 1/0261 |
| 2021/0226589 A1 * | 7/2021 | Han | H03F 3/245 |
| 2022/0393653 A1 * | 12/2022 | Zampardi, Jr. | H03F 3/19 |

* cited by examiner

*Primary Examiner* — Hafizur Rahman
(74) *Attorney, Agent, or Firm* — Studebaker & Brackett PC

(57) ABSTRACT

A power amplifier comprising a first member and a second member including a compound semiconductor region joined to a first face of the first member including a semiconductor region. The second member includes an amplifier circuit including a compound semiconductor element, and multiple clamp diodes connected in multiple stages and between an output port of the amplifier circuit and ground. The first member includes a switch, connected between an extension point, which is a middle point of the multiple clamp diodes and the ground, a temperature sensor, and a switch control circuit which performs on-off control of the switch based on a result of measurement by the temperature sensor. The extension point is connected to the switch via a path including an inter-member connection wire on an interlayer insulating film from the first face of the first member to a surface of the second member.

16 Claims, 14 Drawing Sheets

POWER AMPLIFIER

CROSS-REFERENCE TO RELATED APPLICATION

This application claims benefit of priority to Japanese Patent Application No. 2020-210054, filed Dec. 18, 2020, the entire content of which is incorporated herein by reference.

BACKGROUND

Technical Field

The present disclosure relates to a power amplifier.

Background Art

Radio-frequency power amplifiers are used as one kind of main components provided in mobile terminals. Wireless communication standards, such as carrier aggregation (CA), using many frequency bands are in practical use to increase the wireless transmission capacity of the mobile terminals. The circuit configurations of radio-frequency (RF) front-end modules are made complicated with increase of the number of the used frequency bands. In addition, the circuit configurations of the RF front-end modules are made more complicated to make the sub-6 GHz frequency band of the fifth generation mobile communication system (5G) available.

The complicated circuit configurations of the RF front-end modules increase the losses caused by filters, switches, and so on, which are provided on the transmission lines from the radio-frequency amplifiers to antennas. As a result, the radio-frequency power amplifiers are required to have high power output, in addition to the support of the multiple frequency bands.

Output current and output voltage from the radio-frequency power amplifier are greatly varied in accordance with a variation in phase of a load. The radio-frequency power amplifier is required to have high power output and is also required to improve voltage resistance characteristics in the variation of the load. The characteristics, such as a power amplification ratio, generally has trade-off relationship with the voltage resistance characteristics and it is difficult to improve the voltage resistance characteristics while increasing the power amplification ratio.

U.S. Pat. No. 6,580,321 discloses a radio-frequency power amplifier including multi-stage clamp diodes connected to an output port. The radio-frequency power amplifier includes a feedback circuit that extracts a voltage signal from a middle portion of the clamp diodes that are connected in multiple stages and, if a high voltage signal is detected, varies bias current so as to decrease the gain of the amplifier.

The breakdown voltage of transistors in the amplifier circuit has temperature dependence and is particularly decreased at low temperature. For example, performing feedback control so as not to cause breakdown of the transistors at high temperature may cause the breakdown of the transistors at low temperature. In contrast, performing the feedback control so as not to cause the breakdown of the transistors at low temperature may suppress the output at high temperature despite that the breakdown voltage is well below the upper limit thereof, thus being contrary to the high power output.

SUMMARY

Accordingly, the present disclosure provides a power amplifier capable of preferably suppressing output voltage in accordance with temperature.

According to one aspect of the present disclosure, a power amplifier includes a first member including a semiconductor region and a second member that is joined to a first face, which is one face of the first member, and that includes a compound semiconductor region. The second member includes an amplifier circuit and multiple clamp diodes. The amplifier circuit includes a compound semiconductor element. The multiple clamp diodes are connected in multiple stages and are provided between an output port of the amplifier circuit and ground. The first member includes a switch, a temperature sensor, and a switch control circuit. The switch is connected between an extension point, which is a middle point of the multiple clamp diodes that is connected in multiple stages, and the ground. The switch control circuit performs on-off control of the switch based on a result of measurement by the temperature sensor. The extension point is connected to the switch via a path including an inter-member connection wire that is disposed on an interlayer insulating film from the first face of the first member to a surface of the second member and that is formed of a metal pattern or a path intersecting with an interface with which the first member is joined to the second member.

According to another aspect of the present disclosure, a power amplifier includes a first member including a semiconductor region and a second member that is joined to a first face, which is one face of the first member, and that includes a compound semiconductor region. The second member includes an amplifier circuit, multiple clamp diodes, and a switch. The amplifier circuit includes a compound semiconductor element. The multiple clamp diodes are provided between an output port of the amplifier circuit and ground and are connected in series to each other. The switch is connected between an extension point, which is a middle point of the plurality of clamp diodes that are connected in multiple stages, and the ground. The first member includes a temperature sensor and a switch control circuit. The switch control circuit performs on-off control of the switch based on a result of measurement by the temperature sensor.

Performing the on-off control of the switch based on the result of measurement by the temperature sensor enables the effective number of stages of the clamp diodes that are connected in multiple stages to be varied with temperature. It is possible to set the number of stages of the clamp diodes to a preferable value based on the temperature to preferably suppress instantaneous voltage output to the output port in accordance with the temperature. In addition, since the extension point is connected to the switch via the inter-member connection wire or the path intersecting with the interface between the first member and the second member, an increase in parasitic inductance of the path from the extension point of the clamp diodes that are connected in multiple stages to the ground is suppressed. As a result, the sufficient effect of decreasing the effective number of stages of the clamp diodes by connecting the extension point to the ground is achieved.

DETAILED DESCRIPTION

First Embodiment

Figure 1:
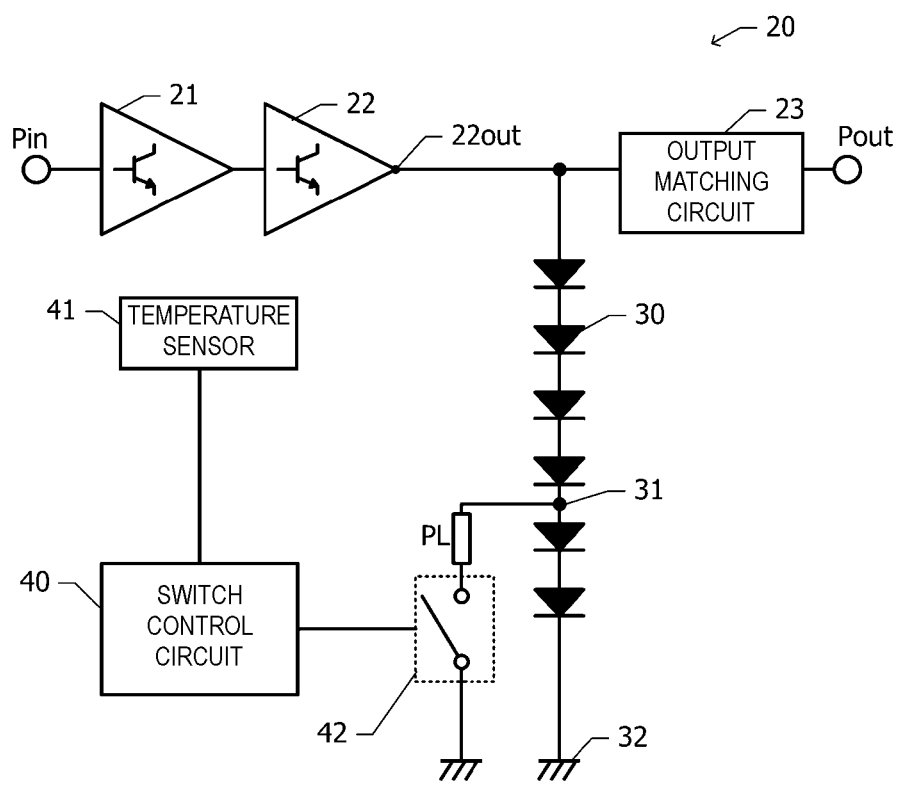
FIG. 1 is a block diagram illustrating a power amplifier according to a first embodiment.

A power amplifier according to a first embodiment will now be described with reference to the drawings in FIG. 1 to FIG. 10. FIG. 1 is a block diagram illustrating the power amplifier according to the first embodiment. The power amplifier according to the first embodiment is composed of two stages including a driver-stage amplifier circuit 21 and a power-stage amplifier circuit 22. A radio-frequency signal input through an input terminal Pin is amplified by the driver-stage amplifier circuit 21 and the amplified radio-frequency signal is further amplified by the power-stage amplifier circuit 22.

The radio-frequency signal that is amplified by the power-stage amplifier circuit 22 and that is output through an output port 22out is output from an output terminal Pout via an output matching circuit 23. Multiple clamp diodes 30 that are connected in multiple stages are connected between the output port 22out of the power-stage amplifier circuit 22 and ground 32. The multiple clamp diodes 30 are connected in a polarity in which the direction from the output port 22out to the ground 32 is the forward direction.

A switch 42 is connected between a middle point (hereinafter referred to as an extension point 31) of the multiple clamp diodes 30 that are connected in multiple stages and the ground 32. For example, six clamp diodes 30 are connected in multiple stages and a point between the second clamp diode 30 from the ground 32 side and the third clamp diode 30 therefrom is set as the extension point 31. Parasitic inductance of a path from the extension point 31 to the ground 32 when the switch 42 is turned on is denoted by PL. For example, radio-frequency current flows through this path. In this case, the path made from a conductor functions as a "current path". A high-frequency voltage signal may be mainly transmitted through this path.

A temperature sensor 41 measures the temperature of each transistor composing the power-stage amplifier circuit 22. For example, the temperature sensor 41 measures the temperature of a point at which heat generated in the transistor is conducted to have a high temperature, that is, the temperature of a point thermally affected by the transistor to indirectly measure the temperature of the transistor. A switch control circuit 40 performs on-off control of the switch 42 based on the result of measurement by the temperature sensor 41. For example, if the measurement value by the temperature sensor 41 is lower than or equal to a first threshold value, the switch control circuit 40 turns on the switch 42. If the measurement value by the temperature sensor 41 is higher than or equal to a second threshold value when the switch 42 is turned on, the switch control circuit 40 turns off the switch 42.

Figure 2:
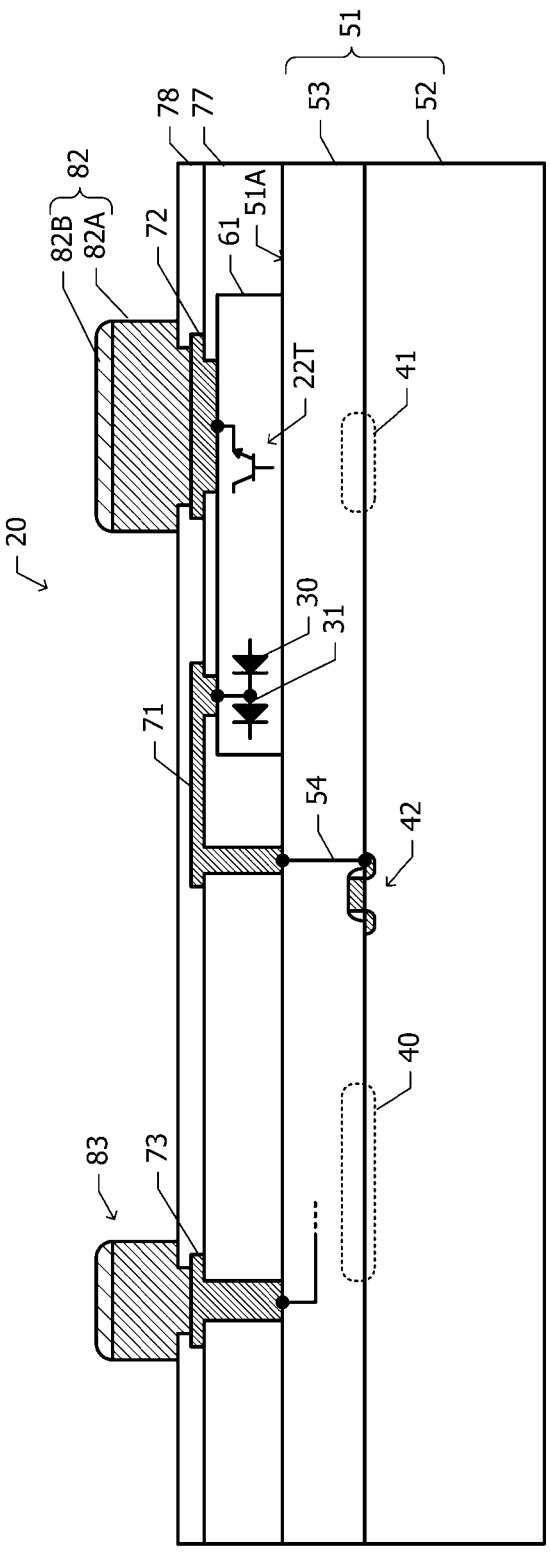
FIG. 2 is a schematic cross-sectional view of the power amplifier according to the first embodiment.

FIG. 2 is a schematic cross-sectional view of the power amplifier according to the first embodiment. Part of the circuits is schematically illustrated using circuit diagram symbols or dotted lines in FIG. 2.

The power amplifier according to the first embodiment includes first members 51 and second members 61. For example, the first members 51 are made from elemental semiconductor and the second members 61 are made from compound semiconductor. The first members 51 include an elemental semiconductor region. For example, the first members 51 include a semiconductor substrate 52 and a multilayer wiring structure 53 disposed on one surface of the semiconductor substrate 52. A protection film covering the surface of the multilayer wiring structure 53 may be disposed. For example, an elemental semiconductor substrate, such as a silicon substrate or a silicon on insulator (SOI) substrate, may be used as the semiconductor substrate 52.

The second members 61 have surface contact with the surface (hereinafter referred to as a first face 51A) of the multilayer wiring structure 53 to be joined to the first face 51A of the multilayer wiring structure 53. When the protection film covering the surface of the multilayer wiring structure 53 is disposed, the surface of the protection film is defined as the first face 51A. The second members 61 include a compound semiconductor region. The structure of the second members 61 will be described in detail below with reference to FIG. 3.

The first members 51 include the switch 42, the switch control circuit 40, and the temperature sensor 41. The switch 42 is composed of, for example, a metal oxide semiconductor field effect transistor (MOSFET) formed on the surface-layer portion of the semiconductor substrate 52. The temperature sensor 41 includes, for example a diode and so on formed on the surface-layer portion of the semiconductor substrate 52. The switch control circuit 40 includes an analog-digital (AD) conversion circuit, a memory circuit, and a voltage generation circuit, which are composed of multiple semiconductor elements and so on formed on the surface-layer portion of the semiconductor substrate 52. The AD conversion circuit converts a measurement value concerning an analog temperature by the temperature sensor 41 into a digital signal. The voltage generation circuit generates a voltage signal for controlling the switch 42 based on control information stored in the memory circuit and the measurement value by the temperature sensor 41.

The second members 61 include the driver-stage amplifier circuit 21 (FIG. 1), the power-stage amplifier circuit 22 (FIG. 1), and the multiple clamp diodes 30 that are connected in multiple stages. The power-stage amplifier circuit 22 includes multiple transistors 22T. An interlayer insulating film 77 is disposed so as to cover the first face 51A of the first members 51 and the second members 61. The top face of the interlayer insulating film 77 is flattened. An inter-member connection wire 71 formed of a metal pattern, pads 72 and 73, and so on are disposed on the interlayer insulating film 77.

The pad 72 is connected to an emitter of the transistor 22T in the power-stage amplifier circuit 22 through an opening provided in the interlayer insulating film 77. The pad 73 is connected to a wire in the multilayer wiring structure 53 through an opening provided in the interlayer insulating film 77. The inter-member connection wire 71 is connected to the extension point 31 of the clamp diodes 30 that are connected in multiple stages through an opening provided in the interlayer insulating film 77 and is connected to the switch 42 through another opening provided in the interlayer insulating film 77 via a wire 54 in the multilayer wiring structure 53.

A wiring layer in which the inter-member connection wire 71, the pads 72 and 73, and so on are disposed may be called a redistribution layer. An insulating protection film 78 is disposed on the interlayer insulating film 77 so as to cover the redistribution layer. An opening included in each of the pads 72 and 73 and so on in a plan view is provided in the protection film 78. Conductive protrusions 82 and 83 are provided on the pads 72 and 73, respectively, exposed in the openings. The conductive protrusions 82 and 83 are protruded from the top face of the protection film 78 and extend over the top face of the protection film 78 around the openings.

The conductive protrusion 82 includes a Cu pillar 82A connected to the pad 72 and a solder layer 82B disposed on the top face of the Cu pillar 82A. The conductive protrusion 82 having the above structure is called a Cu pillar bump. An under-bump metal layer may be disposed on the bottom face of the Cu pillar 82A in order to improve close contact. The conductive protrusion 83 has the same structure as that of the conductive protrusion 82. Instead of the Cu pillar bump, an Au bump, a solder ball bump, a conductor post protruded on the pad, or the like may be used as each of the conductive protrusions 82 and 83 and so on. The bump, such as the Au bump, with no solder layer is also called a pillar. The conductor post protruded on the pad is also called a post.

A ground conductor in the second members 61 is connected to a ground conductor in the first members 51 through redistribution in the redistribution layer. Another configuration may be adopted, in which the ground conductor in the second members 61 and the ground conductor in the first members 51 are connected to a common ground conductor on a module substrate via a conductive protrusion provided in the first members 51 and a conductive protrusion provided in the second members 61, respectively.

Figure 3:
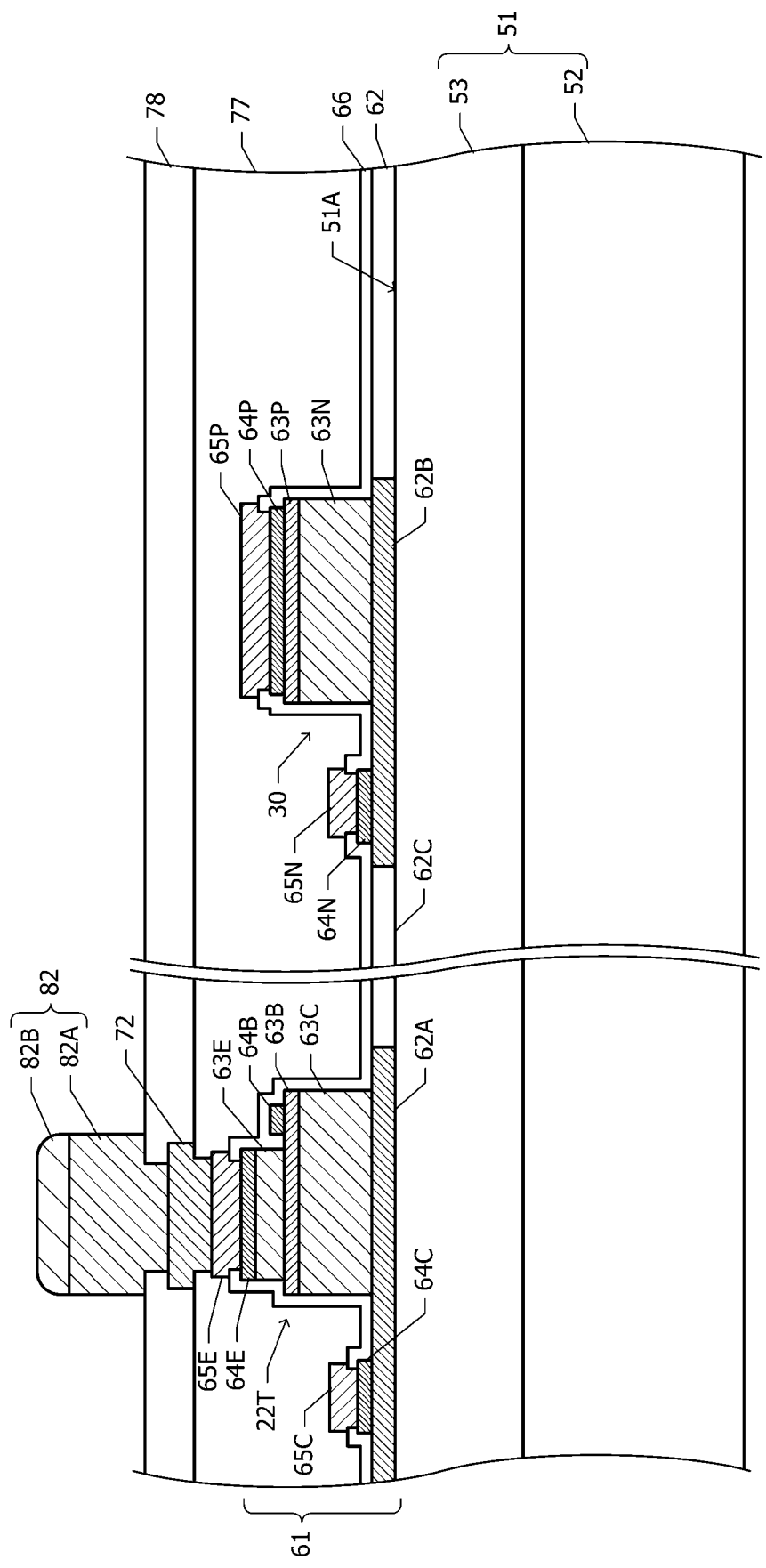
FIG. 3 is a cross-sectional view of part of first members and second members in the power amplifier according to the first embodiment.

FIG. 3 is a cross-sectional view of part of the first members 51 and the second members 61 in a power amplifier 20 according to the first embodiment. The second members 61 include a base semiconductor layer 62 and the transistor 22T in the power-stage amplifier circuit 22 (FIG. 1), the clamp diode 30, and so on, which are disposed on the base semiconductor layer 62. The base semiconductor layer 62 has surface contact with the first face 51A of the first members 51 to be joined to the first face 51A of the first members 51. The base semiconductor layer 62 is segmented into multiple conductive areas 62A, 62B, and so on and an element isolation area 62C with which the multiple conductive areas 62A, 62B, and so on are electrically isolated from each other. The conductive areas 62A, 62B, and so on are made from, for example, n-type GaAs. The element isolation area 62C is formed through ion implantation of impurity into n-type GaAs and insulation.

The transistor 22T is disposed on the conductive area 62A and the clamp diode 30 is disposed on the conductive area 62B. One of the multiple transistors 22T and one of the multiple clamp diodes 30 are illustrated in FIG. 3. The power-stage amplifier circuit 22 includes the multiple transistors 22T connected in parallel to each other.

The transistor 22T includes a collector layer 63C, a base layer 63B, and an emitter layer 63E laminated on the conductive area 62A in this order. The emitter layer 63E is disposed on part of the base layer 63B. The collector layer 63C is made form, for example, n-type GaAs and is electrically connected to the conductive area 62A. The base layer 63B is made from, for example, p-type GaAs. The emitter layer 63E is made from, for example, n-type InGaP. A layer made from n-type GaAs may be disposed on the emitter layer 63E. The collector layer 63C, the base layer 63B, and the emitter layer 63E compose a heterojunction bipolar transistor (HBT).

An emitter electrode 64E is disposed on the emitter layer 63E. The emitter electrode 64E is electrically connected to the emitter layer 63E. A base electrode 64B is disposed on the base layer 63B. The base electrode 64B is electrically connected to the base layer 63B. A collector electrode 64C is disposed on the conductive area 62A. The collector electrode 64C is electrically connected to the collector layer 63C via the conductive area 62A.

The clamp diode 30 includes a cathode layer 63N and an anode layer 63P, which are laminated on the conductive area 62B in this order. The cathode layer 63N and the collector layer 63C are formed through patterning of the same semiconductor layer, and the anode layer 63P and the base layer 63B are formed through patterning of the same semiconductor layer. The cathode layer 63N is electrically connected to the conductive area 62B.

An anode electrode 64P is disposed on the anode layer 63P. The anode electrode 64P is electrically connected to the anode layer 63P. A cathode electrode 64N is disposed on the conductive area 62B. The cathode electrode 64N is electrically connected to the cathode layer 63N via the conductive area 62B.

An interlayer insulating film 66 is disposed on the base semiconductor layer 62 so as to cover the transistor 22T and the clamp diode 30. Openings are provided at certain positions of the interlayer insulating film 66. A first wiring layer is disposed on the interlayer insulating film 66. An emitter wire 65E, a collector wire 65C, an anode wire 65P, and a cathode wire 65N, and so on are included in the first wiring layer. The emitter wire 65E and the collector wire 65C are connected to the emitter electrode 64E and the collector electrode 64C, respectively, through openings provided in the interlayer insulating film 66. The anode wire 65P and the cathode wire 65N are connected to the anode electrode 64P and the cathode electrode 64N, respectively, through openings provided in the interlayer insulating film 66.

The interlayer insulating film 77 is disposed on the first wiring layer. The interlayer insulating film 77 extends to the first face 51A of the first members 51, as illustrated in FIG. 2. Openings are provided at certain positions of the interlayer insulating film 77.

The redistribution layer including the pad 72 is disposed on the interlayer insulating film 77. The pad 72 is connected to the emitter wire 65E through an opening provided in the interlayer insulating film 77. The protection film 78 is disposed so as to cover the pad 72. An opening from which the pad 72 is exposed is provided in the protection film 78. The conductive protrusion 82 is disposed on the pad 72 exposed in the opening and on the protection film 78 around the opening. The conductive protrusion 82 includes the Cu pillar 82A and the solder layer 82B. The conductive protrusion 82 is used as an external connection terminal to connect the emitter of the transistor 22T to an external circuit.

A method of manufacturing the power amplifier according to the first embodiment will now be described with reference to the drawings in FIG. 4A to FIG. 5D. The drawings in FIG. 4A to FIG. 5C are cross-sectional views of the power amplifier during a manufacturing process. FIG. 5D is a cross-sectional view of the finished power amplifier.

Figure 4A:
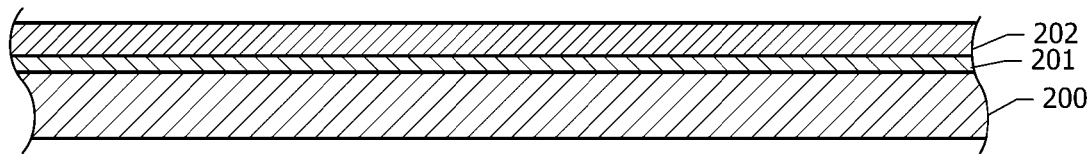
FIG. 4A to FIG. 4F are cross-sectional views of the power amplifier during a manufacturing process.

As illustrated in FIG. 4A, a release layer 201 is epitaxially grown on a single-crystal base substrate 200 made from compound semiconductor, such as GaAs, and an element formation layer 202 is formed on the release layer 201. The transistor 22T, the clamp diodes 30, the first wiring layer, and so on in the second members 61, which are illustrated in FIG. 3, are formed in the element formation layer 202. These circuit elements are formed in accordance with a general semiconductor manufacturing process. FIG. 4A does not illustrate the element structure formed in the element formation layer 202. In this stage, the element formation layer 202 is not separated into the individual second members 61.

Figure 4B:
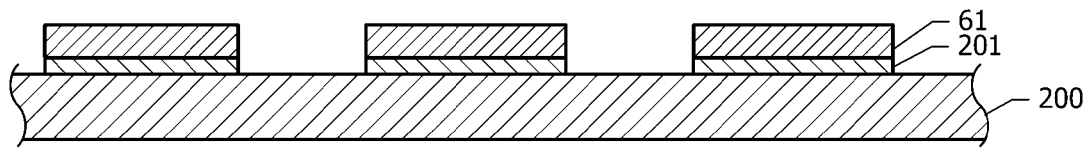

Next, as illustrated in FIG. 4B, the element formation layer 202 (FIG. 4A) and the release layer 201 are subjected to patterning by using a resist pattern (not illustrated in the drawing) as an etch mask. In this stage, the element formation layer 202 (FIG. 4A) is separated into the individual second members 61.

Figure 4C:
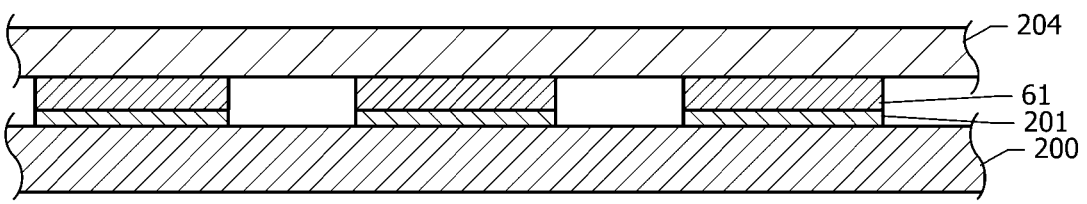

Next, as illustrated in FIG. 4C, a connecting support 204 is bonded on the separated second members 61. As a result, the multiple second members 61 are connected to each other with the connecting support 204. The resist pattern used as an etch mask in the patterning step of FIG. 4B may be left so that the resist pattern exists between the second members 61 and the connecting support 204.

Figure 4D:
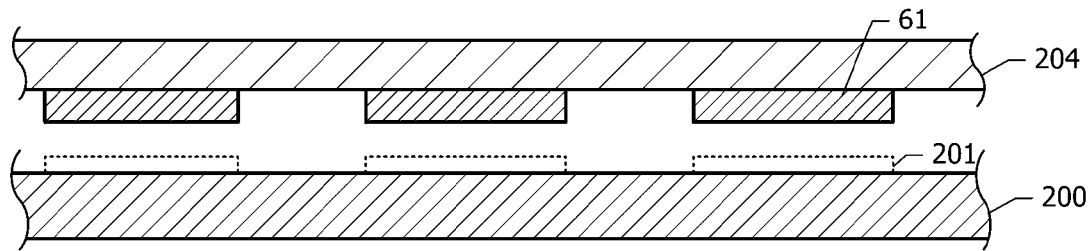

Next, as illustrated in FIG. 4D, the release layer 201 corresponding to the base substrate 200 and the second members 61 is selectively etched. As a result, the second members 61 and the connecting support 204 are released from the base substrate 200. To selectively etch the release layer 201, the release layer 201 is made from compound semiconductor having an etch resistance different from both the etch resistance of the base substrate 200 and the etch resistance of the second members 61.

Figure 4E:
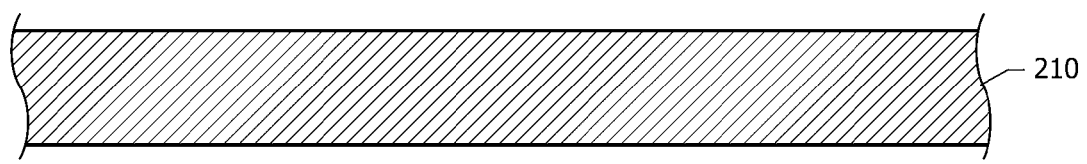

As illustrated in FIG. 4E, a substrate 210 is prepared, on which the switch 42, the switch control circuit 40, the temperature sensor 41, the multilayer wiring structure 53, and so on, which are provided in the first members 51 (FIG. 2), are formed. In this stage, the substrate 210 is not separated into the individual first members 51.

Figure 4F:
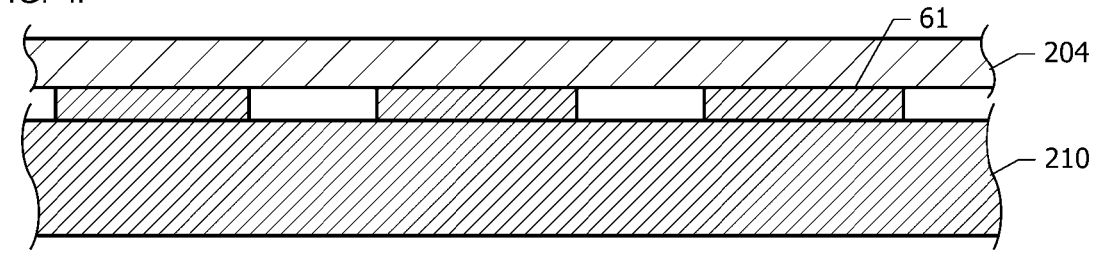

As illustrated in FIG. 4F, the second members 61 are joined to the substrate 210. The second members 61 and the substrate 210 are joined to each other by van der Waals bonding or hydrogen bonding. The second members 61 may be joined to the substrate 210 by, for example, static electricity, covalent bonding, or eutectic alloy bonding. For example, when part of the surface of the substrate 210 is made from Au, the second members 61 and the substrate 210 may be joined to each other by applying pressure in a state in which the second members 61 are in close contact with the Au area.

Figure 5A:
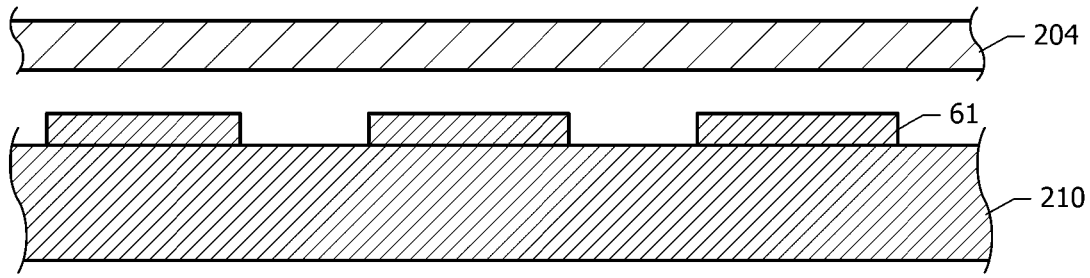
FIG. 5A to FIG. 5C are cross-sectional views of the power amplifier during the manufacturing process and FIG. 5D is a cross-sectional view of the finished power amplifier.
Figure 5B:
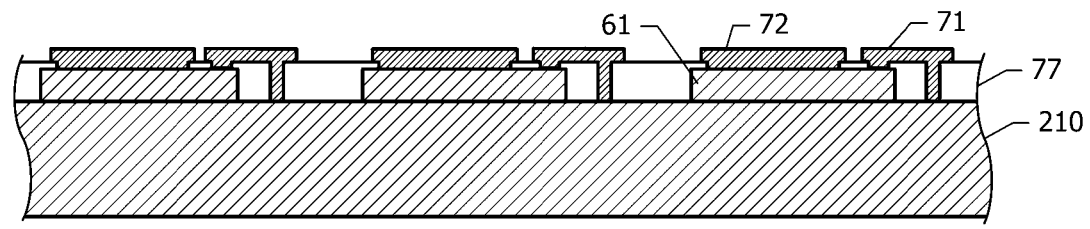

Next, as illustrated in FIG. 5A, the connecting support 204 is released from the second members 61. After releasing the connecting support 204, as illustrated in FIG. 5B, the interlayer insulating film 77 and the redistribution layer are formed over the substrate 210 and the second members 61. The redistribution layer includes the inter-member connection wire 71, the pad 72, and so on.

Figure 5C:
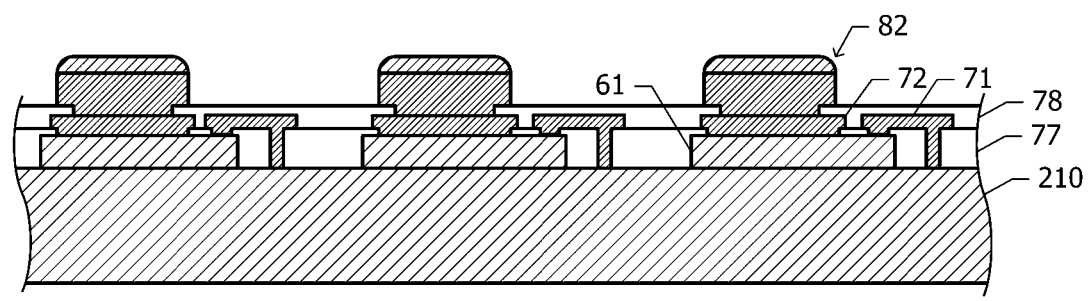
Figure 5D:
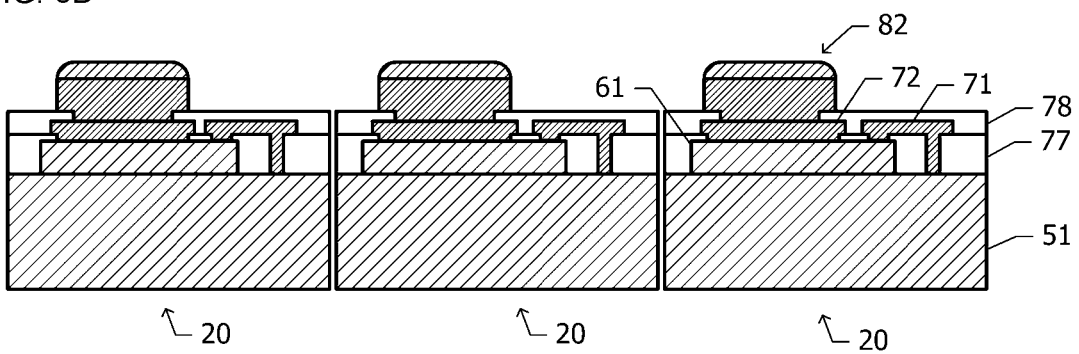

Next, as illustrated in FIG. 5C, the protection film 78 is formed on the redistribution layer, and openings are formed at certain positions of the protection film 78. Then, the conductive protrusions 82 are formed in the openings and on the protection film 78.

Finally, as illustrated in FIG. 5D, the substrate 210 is cut with a dicing machine. This yields the power amplifier 20. The individual first members 51 of the power amplifier 20 are larger than the corresponding second members 61 in a plan view. The power amplifier 20 is flip-flop mounted on the module substrate or the like.

Next, advantageous effects of providing the switch 42 in the power amplifier 20 according to the first embodiment will now be described with reference to the drawings in FIG. 6 to FIG. 8.

Figure 6:
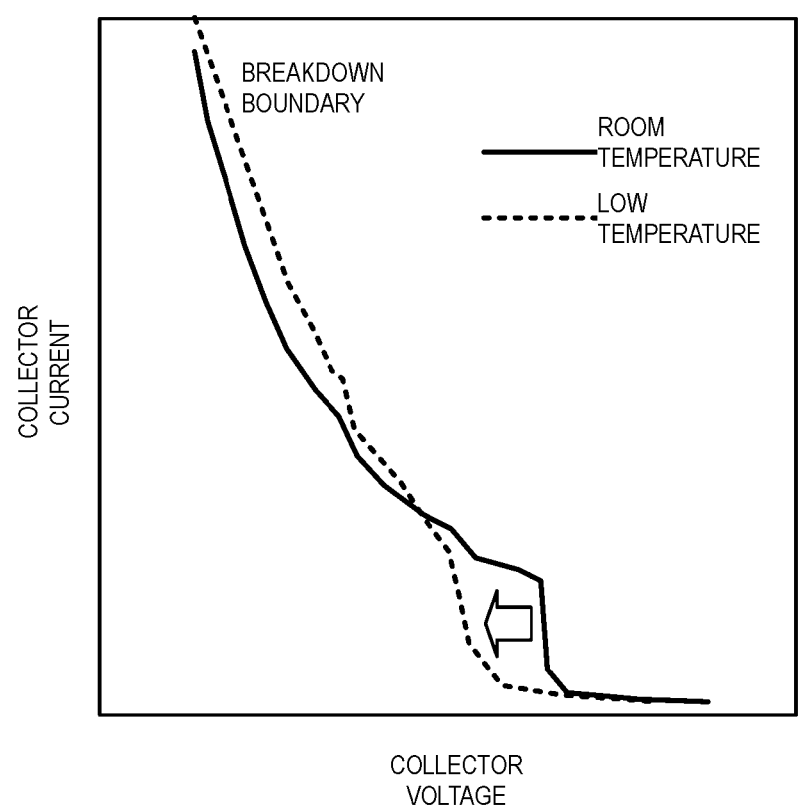
FIG. 6 is a graph indicating an example of breakdown voltage characteristics of an HBT.

FIG. 6 is a graph indicating an example of breakdown voltage characteristics of the HBT. Referring to FIG. 6, the horizontal axis represents collector voltage and the vertical axis represents collector current. A solid line and a broken line in the graph in FIG. 6 indicate a breakdown boundary at room temperature and a breakdown boundary at low temperature, respectively. If the collector voltage and the collector current of the HBT exceed the breakdown boundaries, the HBT is damaged. When the collector voltage is increased at room temperature, an area appears in which the collector current indicating the breakdown boundary is greatly decreased. The collector voltage at this time is referred to breakdown voltage. It is necessary to operate the HBT within a range in which the collector voltage does not exceed the breakdown voltage. When the temperature of the HBT is decreased to low temperature, the breakdown voltage is decreased, as indicated by an arrow in FIG. 6.

Figure 7A:
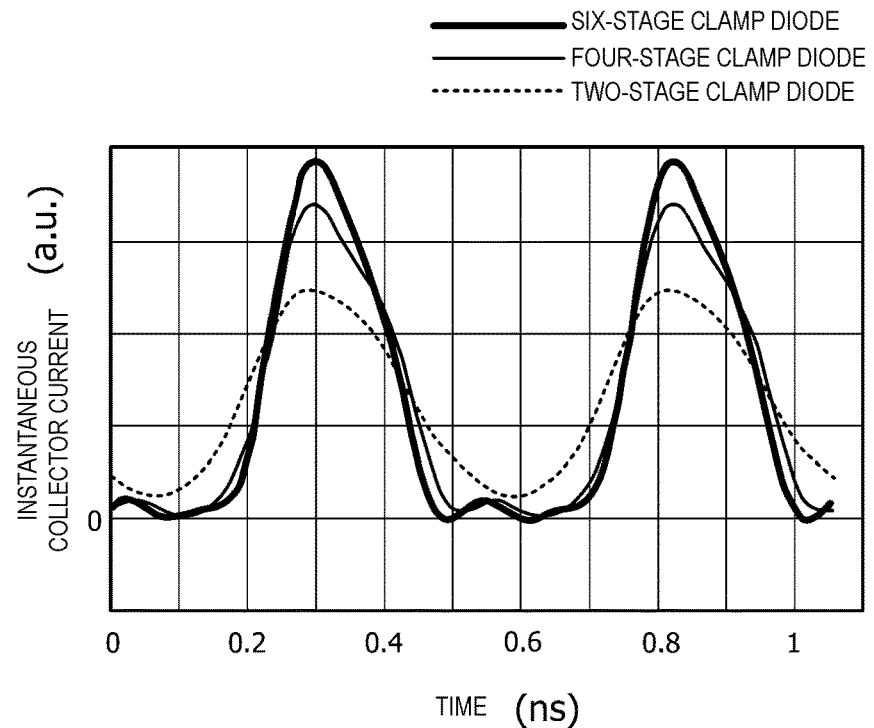
FIG. 7A and FIG. 7B are graphs indicating simulation results of instantaneous collector voltage and instantaneous collector current to be applied to a transistor in a power-stage amplifier circuit illustrated in FIG. 1.
Figure 7B:
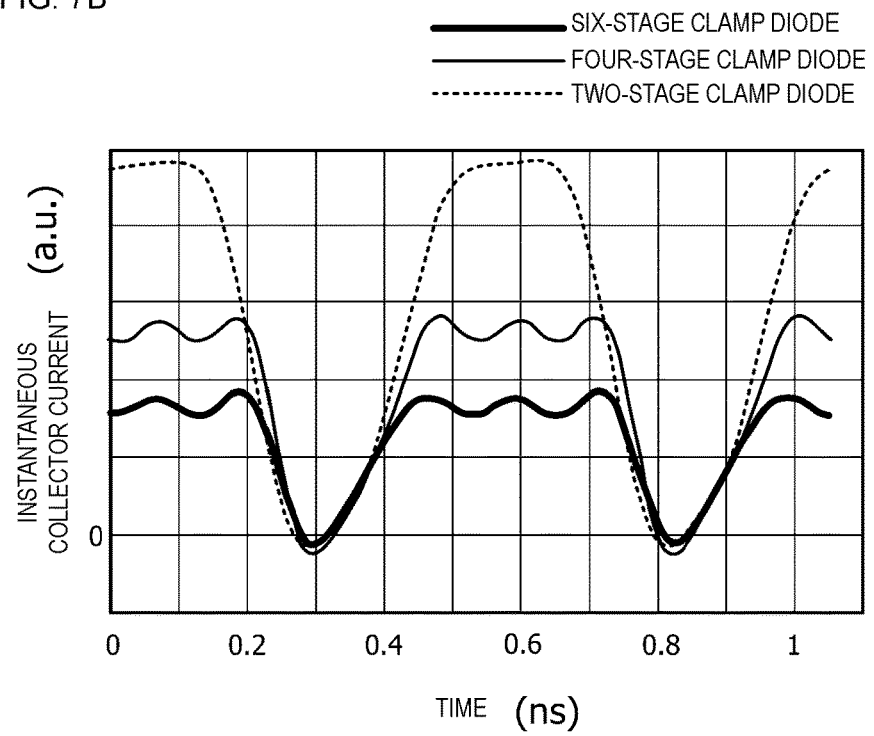
Figure 8:
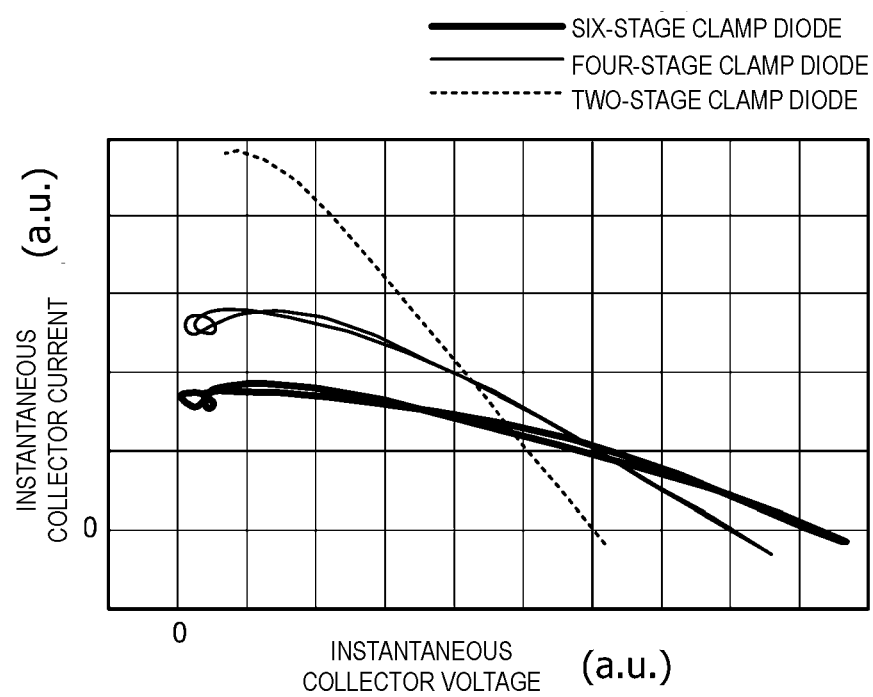
FIG. 8 is a graph indicating the simulation result of the instantaneous collector voltage and the instantaneous collector current to be applied to the transistor in the power-stage amplifier circuit illustrated in FIG. 1.

FIG. 7A, FIG. 7B, and FIG. 8 are graphs indicating simulation results of instantaneous collector voltage and instantaneous collector current to be applied to the transistor 22T in the power-stage amplifier circuit 22 illustrated in FIG. 1. The horizontal axes in FIG. 7A and FIG. 7B represent time in units of "ns", the vertical axis in FIG. 7A represents instantaneous collector voltage in arbitrary units, and the vertical axis in FIG. 7B represents instantaneous collector current in arbitrary units. The horizontal axis in FIG. 8 represents instantaneous collector voltage in arbitrary units and the vertical axis in FIG. 8 represents instantaneous collector current in arbitrary units.

In this simulation, the frequency of an input signal was set to 1.9 GHz. In addition, the simulation was performed on the assumption that impedance mismatching occurs due to load variation and a voltage standing wave ratio (VSWR) is five. Furthermore, the parasitic inductance PL illustrated in FIG. 1 was set to zero. A bold solid line, a thin solid line, and a broken line in each graph indicate the simulation results when the number of stages of the clamp diodes 30 in an equivalent circuit diagram illustrated in FIG. 1 was set to six, four, and two, respectively. Forward direction voltage of each of the clamp diodes 30 is denoted by Vf and the number of stages of the clamp diodes 30 is denoted by N. If the instantaneous collector voltage exceeds Vf x N, forward direction current flows through the clamp diodes 30 and an increase in the instantaneous collector voltage is suppressed. Accordingly, the peak value of the instantaneous collector voltage is suppressed as the number-of-stages N of the clamp diodes 30 is decreased.

Since a dynamic load line sufficient for the collector voltage is capable of being ensured when the number of stages of the clamp diodes 30 is increased, the peak value of the instantaneous collector voltage is increased. On this condition, the peak value of the instantaneous collector current in current-voltage characteristics is suppressed, compared with a case in which the clamp diodes 30 have a small number of stages.

The simulation results in FIG. 7A, FIG. 7B, and FIG. 8 indicate that the effect of decreasing the peak value of the instantaneous collector voltage is increased when the number of stages of the clamp diodes 30 is decreased. The number of stages of the clamp diodes 30 is decreased at low temperature in order to cause the instantaneous collector voltage of the transistor not to exceed the breakdown boundary (FIG. 6). In the first embodiment, the effective number of stages of the clamp diodes 30 is decreased by turning the switch 42 (FIG. 1) on when the measurement value by the temperature sensor 41 is lower than or equal to the first threshold value. Accordingly, the peak value of the instantaneous collector voltage of the transistor 22T at low temperature is capable of being suppressed even if the load variation occurs. As a result, it is possible to suppress the damage of the transistor 22T.

In the first embodiment, when the temperature of the transistor exceeds the second threshold value, the switch 42 is turned off to return the effective number of stages of the clamp diodes 30 to the original value. Accordingly, for example, at room temperature, it is possible to set the instantaneous collector voltage within a range near the upper limit value of the breakdown boundary of the transistor 22T to suppress an unnecessary decrease in the output.

Next, advantageous effects of connecting the extension point 31 (FIG. 2) of the clamp diodes 30 that are connected in multiple stages to the switch 42 with the inter-member connection wire 71 in the power amplifier 20 according to the first embodiment will now be described with reference to FIG. 9A, FIG. 9B, and FIG. 10.

Figure 9A:
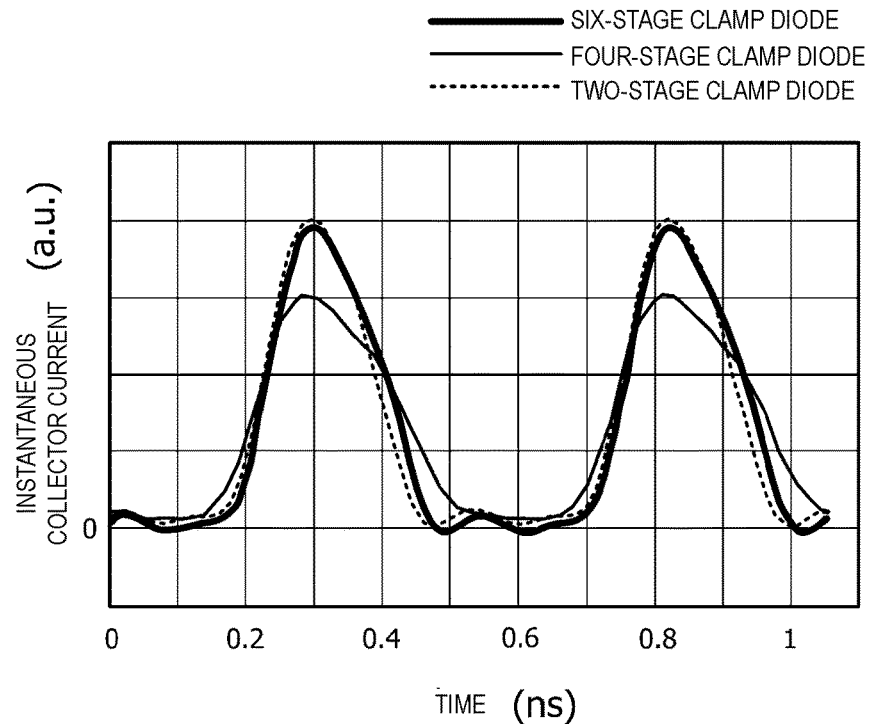
FIG. 9A and FIG. 9B are graphs indicating simulation results of the instantaneous collector voltage and the instantaneous collector current to be applied to the transistor in the power-stage amplifier circuit illustrated in FIG. 1.
Figure 9B:
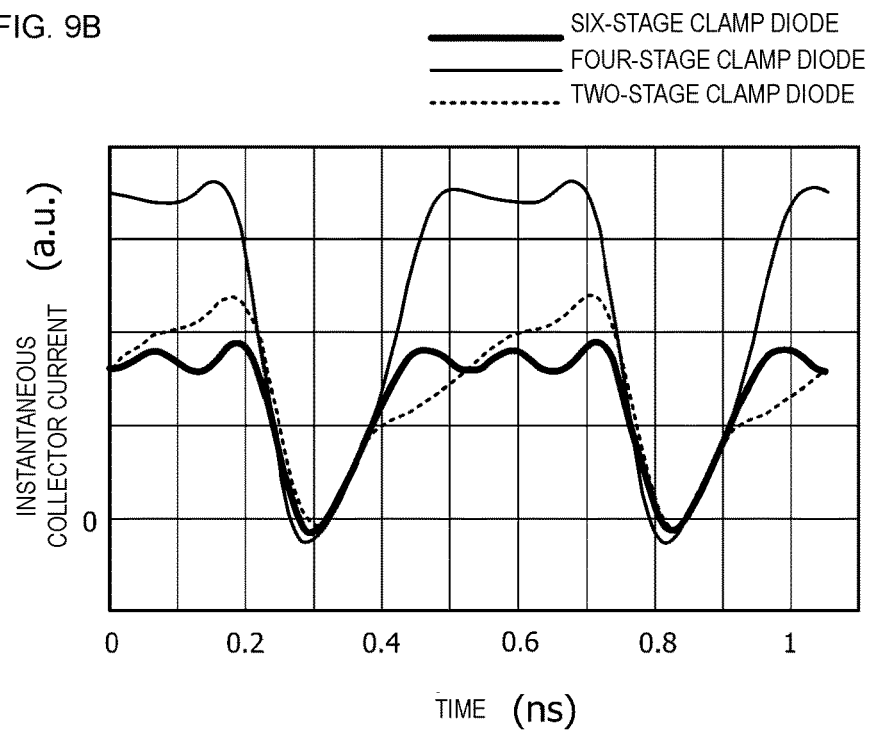
Figure 10:
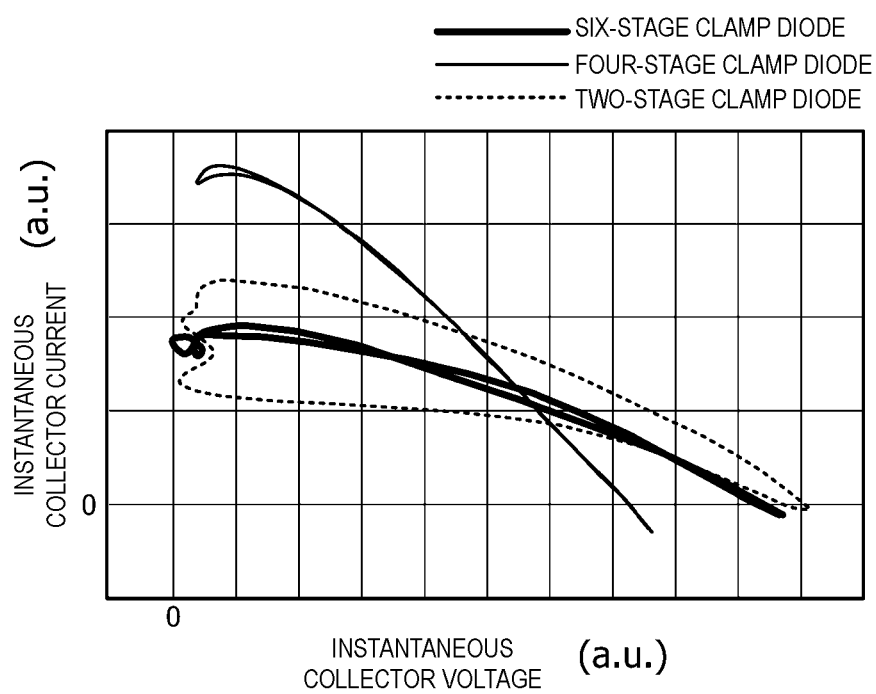
FIG. 10 is a graph indicating the simulation result of the instantaneous collector voltage and the instantaneous collector current to be applied to the transistor in the power-stage amplifier circuit illustrated in FIG. 1.

FIG. 9A, FIG. 9B, and FIG. 10 are graphs indicating simulation results of the instantaneous collector voltage and the instantaneous collector current to be applied to the transistor 22T in the power-stage amplifier circuit 22 illustrated in FIG. 1. The horizontal axes in FIG. 9A and FIG. 9B represent time in units of "ns", the vertical axis in FIG. 9A represents instantaneous collector voltage in arbitrary units, and the vertical axis in FIG. 9B represents instantaneous collector current in arbitrary units. The horizontal axis in FIG. 10 represents instantaneous collector voltage in arbitrary units and the vertical axis in FIG. 10 represents instantaneous collector current in arbitrary units.

In this simulation, the frequency of the input signal and the voltage standing wave ratio due to load variation were set to the same values as in the simulation condition in FIG. 7A, FIG. 7B, and FIG. 8. A bold solid line and a thin solid line in each graph indicate the simulation results when the parasitic inductance PL of the equivalent circuit diagram in FIG. 1 was set to zero and the number of stages of the clamp diodes 30 was set to six and three, respectively. A broken line in each graph indicates the simulation result when the parasitic inductance PL of the equivalent circuit diagram in FIG. 1 was set to 1 nH and the number of stages of the clamp diodes 30 was set to three.

If the number of stages of the clamp diodes 30 is decreased from six to three on the condition that the parasitic inductance PL is set to zero, the peak value of the instantaneous collector voltage is suppressed, as indicated by the bold solid line and the thin solid line. In contrast, on the condition that the parasitic inductance PL was set to 1 nH, the effect of suppressing the peak value of the instantaneous collector voltage is not achieved even if the number of stages of the clamp diodes 30 is decreased, as illustrated by the bold solid line and the broken line. For example, when the extension point 31 of the clamp diodes 30 that are connected in multiple stages is connected to the switch 42 with a bonding wire, the parasitic inductance of about 1 nH occurs. Accordingly, when the bonding wire is used, the effect of further decreasing the peak value of the instantaneous collector voltage is hardly achieved even if the effective number of stages of the clamp diodes 30 is decreased by turning on the switch 42.

The reason that the effect of decreasing the peak value of the instantaneous collector voltage is hardly achieved will now be described. When the parasitic inductance PL is increased, the impedance of a path from the output port of the power-stage amplifier circuit 22 (FIG. 1) to the ground through the switch 42 is increased. In addition, since the output impedance of the power-stage amplifier circuit 22 is originally low, the load impedance including the output matching circuit 23 (FIG. 1) is set to a low value. The impedance of the path to the ground through the switch 42 is relatively higher than the load impedance due to the parasitic inductance PL and, thus, it is difficult to achieve the effect of letting out the peak voltage of the instantaneous collector voltage to the ground.

Since the extension point 31 of the clamp diodes 30 that are connected in multiple stages is connected to the switch 42 with the inter-member connection wire 71 (FIG. 2) included in the redistribution layer in the first embodiment, the parasitic inductance PL is decreased, compared with the configuration in which the extension point 31 of the clamp diodes 30 that are connected in multiple stages is connected to the switch 42 with the bonding wire. Accordingly, decreasing the effective number of stages of the clamp diodes 30 by turning on the switch 42 achieves the sufficient effect of further suppressing the peak value of the instantaneous collector voltage.

Other advantageous effects of the first embodiment will now be described.

Since the second members 61 have surface contact with the first members 51 in the first embodiment (FIG. 2), the thermal resistance of a heat transfer path from the transistor 22T in the second members 61 to the first members 51 is decreased. The heat generated in the transistor 22T is conducted to the first members 51 through an interface between the first members 51 and the second members 61. The heat conducted to the first members 51 is diffused in the first members 51 and is externally discharged from the surface of the first members 51. In addition, since the first members 51 themselves have a heat capacity higher than that of the second members 61, the first members 51 function as a heat sink.

In order to improve the discharge characteristics through the first members 51, the semiconductor region of the first members 51, for example, the semiconductor substrate 52 is preferably made from a semiconductor material having a thermal conductivity higher than that of the compound semiconductor material composing the transistor 22T. For example, the semiconductor region of the first members 51 is preferably made from the elemental semiconductor, such as SiC.

In addition, in the first embodiment (FIG. 2), the heat generated in the transistor 22T is conducted to the module substrate through the pad 72 and the conductive protrusion 82. Since the two paths: the heat transfer path from the transistor 22T to the first members 51 and the heat transfer path to the module substrate through the conductive protrusion 82 are formed in the above manner, the effect of suppressing the increase in temperature of the transistor 22T is capable of being increased.

Furthermore, in the first embodiment, the temperature sensor 41 is provided in the first members 51 having surface contact with the second members 61. Accordingly, the increase in temperature caused by self-heating of the transistor 22T provided in the second members 61 is rapidly reflected in the measurement value by the temperature sensor 41. Consequently, the advantageous effect of rapidly reflecting the variation in temperature of the transistor 22T in the on-off control of the switch 42 is achieved. In order to easily reflect the variation in temperature of the transistor 22T in the measurement value by the temperature sensor 41, the temperature sensor 41 and the second member 61 are preferably disposed so as to be overlapped with each other in a plan view, as illustrated in FIG. 2.

Furthermore, in the first embodiment, the second members 61 including the transistor 22T made from the compound semiconductor have surface contact with the first members 51 having the switch control circuit 40 and so on provided therein. Accordingly, the power amplifier 20 is reduced in size, compared with a configuration in which the chip that includes the transistor 22T and that is made from the compound semiconductor and the chip that includes the switch control circuit 40 and so on are separately mounted on the module substrate.

Second Embodiment

The power amplifier according to a second embodiment will now be described with reference to FIG. 11 and FIG. 12. A description of the components common to those of the power amplifier according to the first embodiment, which are described with reference to the drawings in FIG. 1 to FIG. 10, is omitted herein.

Figure 11:
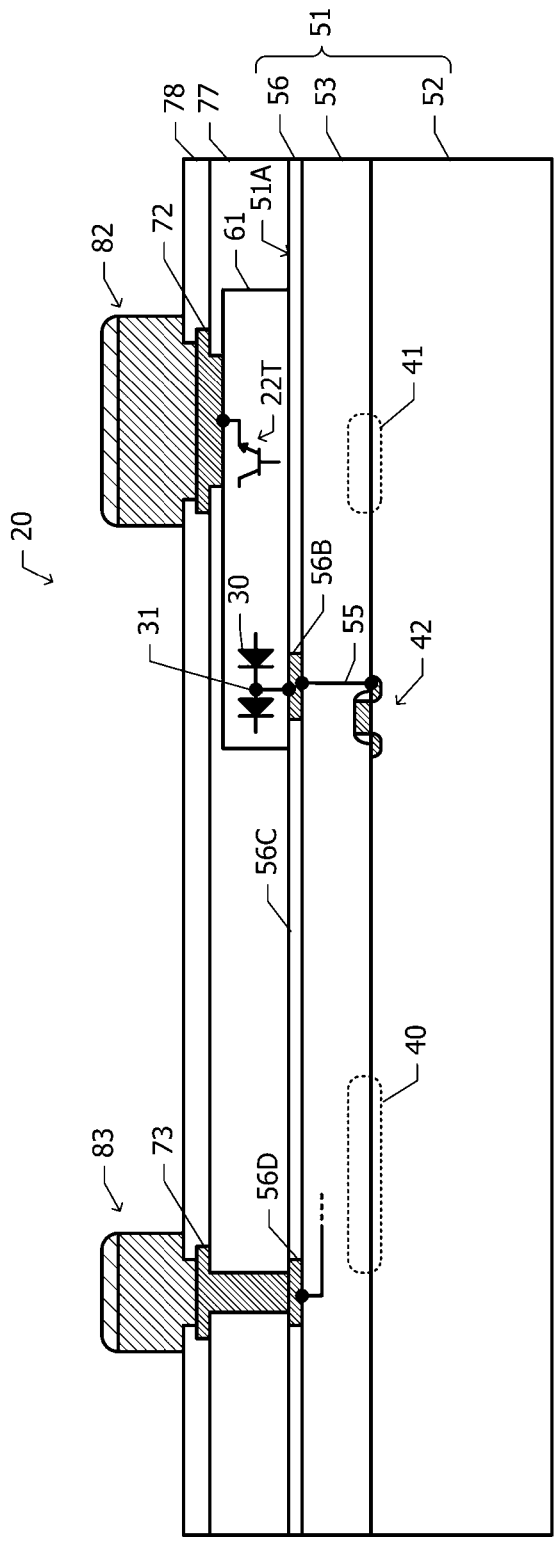
FIG. 11 is a schematic cross-sectional view of the power amplifier according to a second embodiment.

FIG. 11 is a schematic cross-sectional view of the power amplifier 20 according to the second embodiment. Part of the circuits is schematically illustrated using circuit diagram symbols or dotted lines in FIG. 11. In the first embodiment (FIG. 2), the extension point 31 of the clamp diodes 30 that are connected in multiple stages is connected to the switch 42 with the inter-member connection wire 71 in the redistribution layer. In contrast, in the second embodiment, the extension point 31 of the clamp diodes 30 that are connected in multiple stages is connected to the switch 42 via a path intersecting with the interface with which the second members 61 have surface contact with the first members 51.

The first members 51 in the power amplifier 20 according to the second embodiment includes an adhesion layer 56 disposed on the multilayer wiring structure 53. The adhesion layer 56 is segmented into multiple metal areas 56B, 56D, and so on and an insulating area 56C with which the multiple metal areas are insulated from each other. The adhesion layer 56 is capable of being formed using, for example, a damascene method. In the manufacturing process illustrated in FIG. 4E, the adhesion layer 56 is formed on the substrate 210. The extension point 31 of the clamp diodes 30 that are connected in multiple stages is electrically connected to the switch 42 via a path including the metal area 56B and a wire 55 in the multilayer wiring structure 53. This path intersects with the interface with which the first members 51 have surface contact with the second members 61.

The pad 73 is connected to a wire in the multilayer wiring structure 53 via the metal area 56D of the adhesion layer 56.

Figure 12:
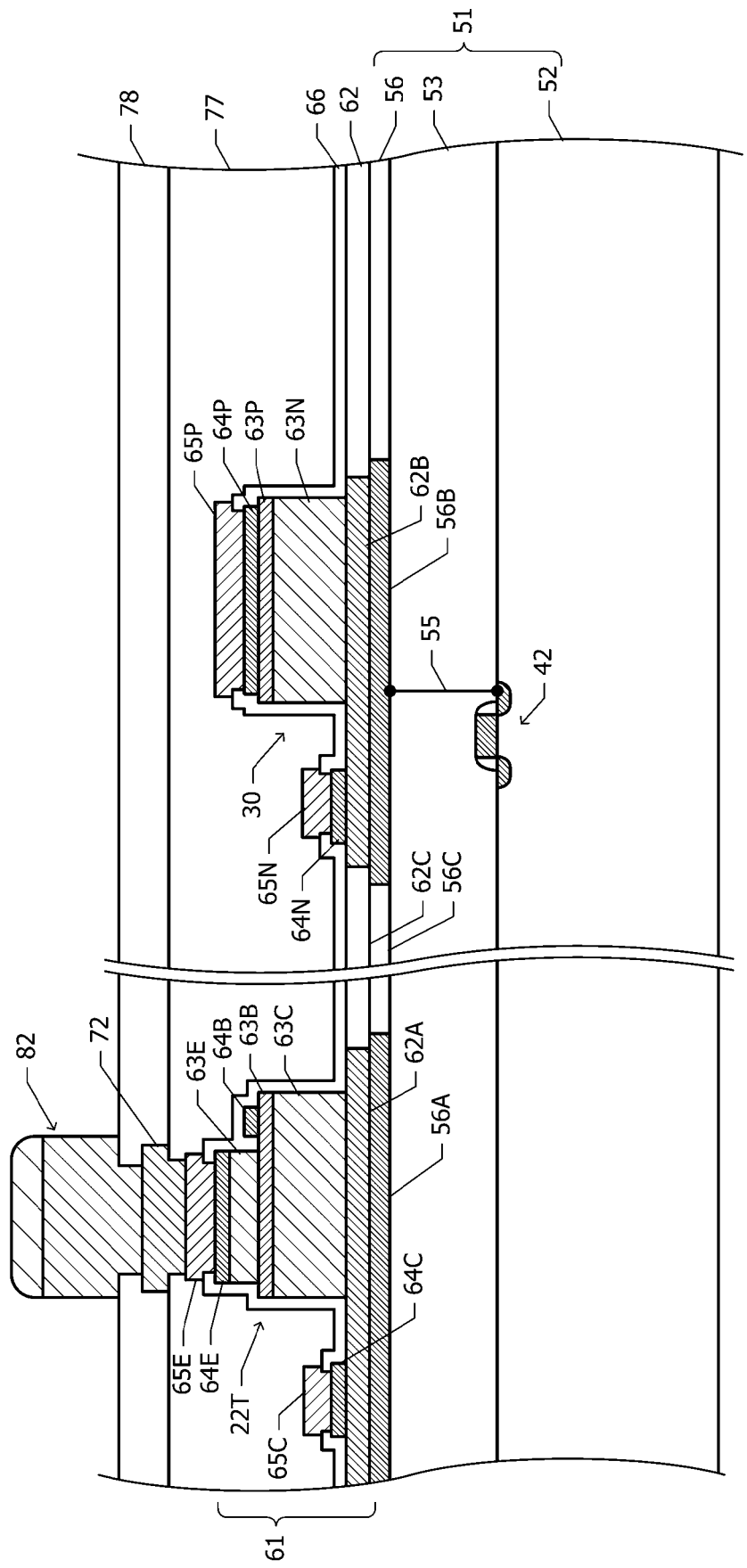
FIG. 12 is a cross-sectional view of part of the first members and the second members in the power amplifier according to the second embodiment.

FIG. 12 is a cross-sectional view of part of the first members 51 and the second members 61 in the power amplifier according to the second embodiment. In the first embodiment (FIG. 3), the base semiconductor layer 62 in the second members 61 is joined to the multilayer wiring structure 53 in the first members 51. In contrast, in the second embodiment, the base semiconductor layer 62 in the second members 61 is joined to the adhesion layer 56 in the first members 51. The conductive area 62A including the transistor 22T in a plan view is overlapped with a metal area 56A of the adhesion layer 56 to be electrically connected to the metal area 56A of the adhesion layer 56. The conductive area 62B including one clamp diode 30 in a plan view is overlapped with the metal area 56B of the adhesion layer 56 to be electrically connected to the metal area 56B of the adhesion layer 56. The element isolation area 62C of the base semiconductor layer 62 is overlapped with the insulating area 56C of the adhesion layer 56 in a plan view to ensure electrical insulation between the multiple conductive areas of the base semiconductor layer 62 and between the multiple metal areas of the adhesion layer 56.

The metal area 56B is electrically connected to the switch 42 via the wire 55 in the multilayer wiring structure 53. The cathode layer 63N of the clamp diode 30 in the cross section illustrated in FIG. 12 corresponds to the extension point 31 (FIG. 1). The conductive area 62B, the metal area 56B, and the wire 55 compose the path between the extension point 31 (FIG. 1) and the switch 42.

Advantageous effects of the second embodiment will now be described.

Also in the second embodiment, the extension point 31 (FIG. 1) of the clamp diodes 30 that are connected in multiple stages is electrically connected to the switch 42 without using the bonding wire. The parasitic inductance of the path, which is composed of the conductive area 62B, the metal area 56B, and the wire 55 and with which the extension point 31 is connected to the switch 42, is lower than the parasitic inductance of the bonding wire. Accordingly, also in the second embodiment, decreasing the effective number of stages of the clamp diodes 30 by turning on the switch 42 achieves the sufficient effect of further suppressing the peak value of the instantaneous collector voltage, as in the first embodiment.

In addition, also in the second embodiment, the effect of suppressing the increase in temperature of the transistor 22T is achieved and the power amplifier 20 is reduced in size, as in the first embodiment.

Third Embodiment

The power amplifier according to a third embodiment will now be described with reference to FIG. 13. A description of the components common to those of the power amplifier according to the first embodiment, which are described with reference to the drawings in FIG. 1 to FIG. 10, is omitted herein.

Figure 13:
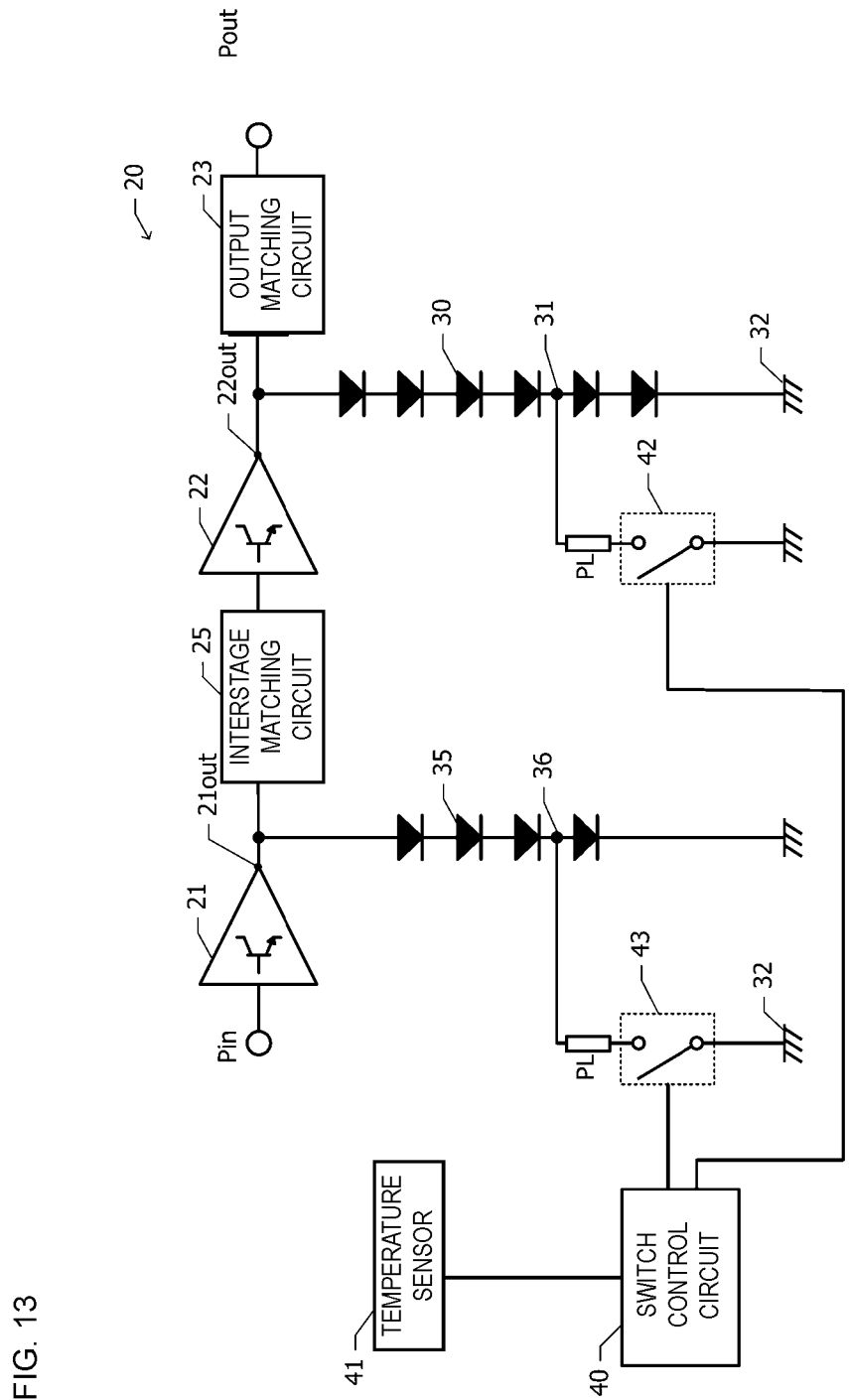
FIG. 13 is a block diagram of the power amplifier according to a third embodiment.

FIG. 13 is a block diagram of the power amplifier according to the third embodiment. In the first embodiment (FIG. 1), the clamp diodes 30 that are connected in multiple stages are connected between the output port 22out of the power-stage amplifier circuit 22 and the ground 32 and no clamp diode is connected to an output port of the driver-stage amplifier circuit 21. In contrast, in the third embodiment, clamp diodes 35 that are connected in multiple stages are connected also between an output port 21out of the driver-stage amplifier circuit 21 and the ground 32. It is not necessary to make the number of stages of the clamp diodes 35 connected to the driver-stage amplifier circuit 21 equal to the number of stages of the clamp diodes 30 connected to the power-stage amplifier circuit 22. An interstage matching circuit 25 is connected between the driver-stage amplifier circuit 21 and the power-stage amplifier circuit 22.

An extension point 36 of the multi-stage clamp diodes 35 of the driver-stage amplifier circuit 21 is connected to the ground 32 via a switch 43. The extension point 36 at the driver-stage amplifier circuit 21 side is connected to the switch 43 via another inter-member connection wire disposed in the same redistribution layer as that of the inter-member connection wire 71 (FIG. 2). The switch control circuit 40 performs the on-off control of the switch 42 and the switch 43.

Advantageous effects of the third embodiment will now be described.

In the third embodiment, the extension point 36 of the multi-stage clamp diodes 35 of the driver-stage amplifier circuit 21 is connected to the switch 43 via the inter-member connection wire in the redistribution layer without using the bonding wire. Accordingly, also in the driver-stage amplifier circuit 21, decreasing the effective number of stages of the clamp diodes 35 by turning on the switch 43 achieves the sufficient effect of suppressing the peak value of the instantaneous collector voltage. In addition, also in the third embodiment, the effect of suppressing the increase in temperature of the transistor 22T is achieved and the power amplifier 20 is reduced in size, as in the first embodiment.

A modification of the third embodiment will now be described.

Although the extension point 36 of the clamp diodes 35 that are connected in multiple stages of the driver-stage amplifier circuit 21 is connected to the switch 43 via the inter-member connection wire in the redistribution layer in the third embodiment, the extension point 36 may be connected to the switch 43 via a path intersecting with the interface with which the first members 51 have surface contact with the second members 61, as in the second embodiment illustrated in FIG. 11 and FIG. 12.

Although the two switches 42 and 43 are used in the third embodiment, one single-pole double-throw (SPDT) switch may be used, instead of the two switches 42 and 43. In this case, a common terminal of the SPDT switch is connected to the ground 32, one contact thereof is connected to the extension point 31, and the other contact thereof is connected to the extension point 36. The driver-stage amplifier circuit 21 and the power-stage amplifier circuit 22 may share one single pole single throw (SPST) switch. In this case, one contact of the SPST switch is connected to both of the two extension points 31 and 36.

Fourth Embodiment

The power amplifier according to a fourth embodiment will now be described with reference to FIG. 14. A description of the components common to those of the power amplifier according to the first embodiment, which are described with reference to the drawings in FIG. 1 to FIG. 10, is omitted herein.

Figure 14:
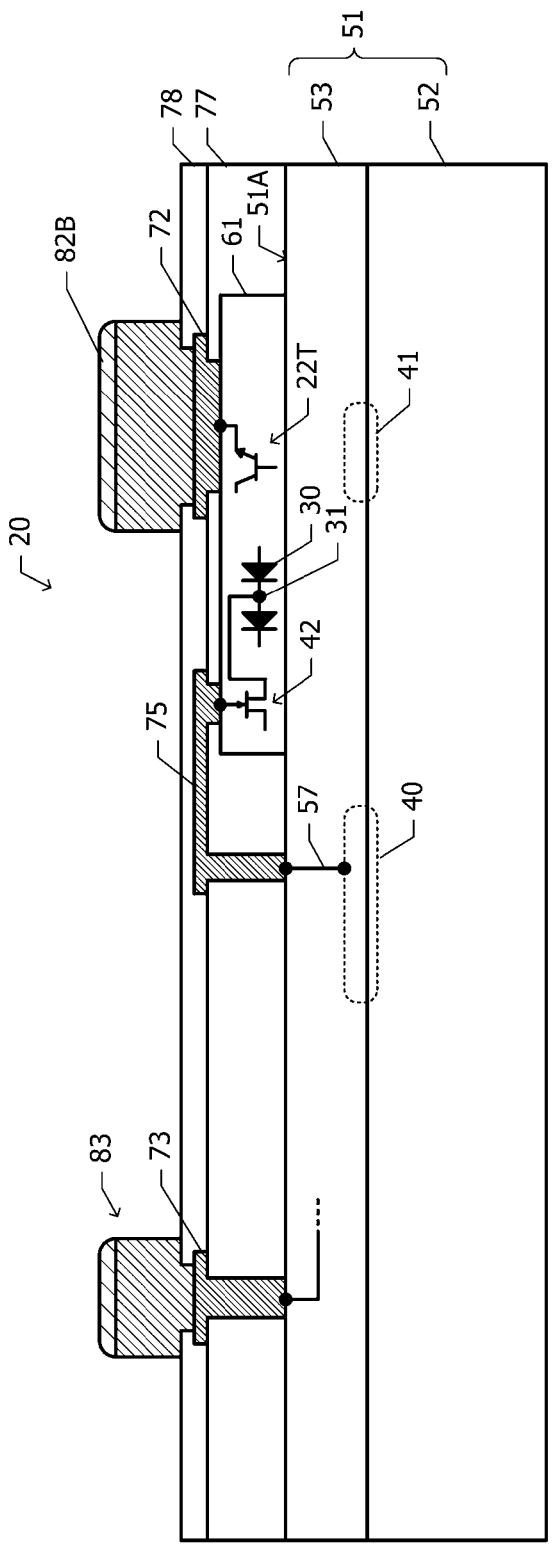
FIG. 14 is a schematic cross-sectional view of the power amplifier according to a fourth embodiment.

FIG. 14 is a schematic cross-sectional view of the power amplifier according to the fourth embodiment. Part of the circuits is schematically illustrated using circuit diagram symbols or dotted lines in FIG. 14. In the first embodiment (FIG. 2), the switch 42 is provided in the first members 51. In contrast, in the fourth embodiment, the switch 42 is provided in the second members 61. The switch 42 is formed of, for example, a field effect transistor (FET) or a high electron mobility transistor (HEMT) made from the compound semiconductor. The transistor 22T of the power-stage amplifier circuit 22 is a heterojunction bipolar transistor. Accordingly, a BiFET structure or a BiHEMT structure is used for the second members 61.

Since both the clamp diodes 30 that are connected in multiple stages and the switch 42 are provided in the second members 61, the extension point 31 of the clamp diodes 30 that are connected in multiple stages is connected to the switch 42 via a wire formed of a metal pattern in the second members 61. The switch control circuit 40 provided in the first members 51 supplies a control signal for the on-off control to the switch 42 via a wire 57 in the multilayer wiring structure 53 and an inter-member connection wire 75 in the redistribution layer.

Advantageous effects of the fourth embodiment will now be described.

In the fourth embodiment, the extension point 31 of the clamp diodes 30 that are connected in multiple stages is connected to the switch 42 via the wire formed of the metal pattern in the second members 61 and no bonding wire is used for the connection between the extension point 31 and the switch 42. Accordingly, the parasitic inductance PL of the path from the extension point 31 to the ground 32 (FIG. 1) when the switch 42 is turned on is capable of being reduced. As a result, the sufficient effect of further suppressing the peak value of the instantaneous collector voltage by turning on the switch 42 is achieved. In addition, also in the fourth embodiment, the effect of suppressing the increase in temperature of the transistor 22T is achieved and the power amplifier 20 is reduced in size, as in the first embodiment.

The respective embodiments described above are only examples and partial replacement or combination of the components described in different embodiments is available. The same effects and advantages of the same components in multiple embodiments are not successively described in the respective embodiments. In addition, the present disclosure is not limited to the above embodiments. For example, availability of various modifications, changes, combinations, and so on is obvious to the person skilled in the art.

What is claimed is:

1. A power amplifier comprising:
   a first member including a semiconductor region; and
   a second member that is joined to a first face, which is one face of the first member, and that includes a compound semiconductor region,
   wherein the second member includes
      an amplifier circuit that includes a compound semiconductor element, and
      a plurality of clamp diodes connected in multiple stages and disposed between an output port of the amplifier circuit and ground,
   wherein the first member includes
      a switch connected between an extension point, which is a middle point of the plurality of clamp diodes that is connected in multiple stages, and the ground,
      a temperature sensor, and a switch control circuit configured to perform on-off control of the switch based on a result of measurement by the temperature sensor, and wherein the extension point is connected to the switch via a path including an inter-member connection wire that is disposed on an interlayer insulating film from the first face of the first member to a surface of the second member and that is configured of a metal pattern or a path intersecting with an interface with which the first member is joined to the second member.

2. The power amplifier according to claim 1, wherein the temperature sensor is disposed at a position overlapped with the second member in a plan view.

3. The power amplifier according to claim 1, further comprising:
a conductive protrusion protruded from the first face of the first member and the surface of the second member.

4. The power amplifier according to claim 1, wherein the second member has surface contact with the first face of the first member.

5. The power amplifier according to claim 2, further comprising:
a conductive protrusion protruded from the first face of the first member and the surface of the second member.

6. The power amplifier according to claim 2, wherein the second member has surface contact with the first face of the first member.

7. The power amplifier according to claim 3, wherein the second member has surface contact with the first face of the first member.

8. The power amplifier according to claim 5, wherein the second member has surface contact with the first face of the first member.

9. A power amplifier comprising:
a first member including a semiconductor region; and
a second member that is joined to a first face, which is one face of the first member, and that includes a compound semiconductor region,
wherein the second member includes
an amplifier circuit that includes a compound semiconductor element,
a plurality of clamp diodes disposed between an output port of the amplifier circuit and ground and connected in series to each other, and
a switch connected between an extension point, which is a middle point of the plurality of clamp diodes that are connected in multiple stages, and the ground, and
wherein the first member includes
a temperature sensor, and
a switch control circuit configured to perform on-off control of the switch based on a result of measurement by the temperature sensor.

10. The power amplifier according to claim 9, wherein the temperature sensor is disposed at a position overlapped with the second member in a plan view.

11. The power amplifier according to claim 9, further comprising:
a conductive protrusion protruded from the first face of the first member and a surface of the second member.

12. The power amplifier according to claim 10, further comprising:
a conductive protrusion protruded from the first face of the first member and a surface of the second member.

13. The power amplifier according to claim 9, wherein the second member has surface contact with the first face of the first member.

14. The power amplifier according to claim 10, wherein the second member has surface contact with the first face of the first member.

15. The power amplifier according to claim 11, wherein the second member has surface contact with the first face of the first member.

16. The power amplifier according to claim 12, wherein the second member has surface contact with the first face of the first member.

* * * * *